(12) United States Patent
Shih et al.

(10) Patent No.: US 12,362,035 B2
(45) Date of Patent: Jul. 15, 2025

(54) FAILURE ANALYSIS AND DETECTION METHOD FOR MEMORY

(71) Applicant: Powerchip Semiconductor Manufacturing Corporation, Hsinchu (TW)

(72) Inventors: Chingching Shih, Hsinchu County (TW); Jen-Hao Chuang, New Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 284 days.

(21) Appl. No.: 18/164,618

(22) Filed: Feb. 6, 2023

(65) Prior Publication Data
US 2024/0185944 A1    Jun. 6, 2024

(30) Foreign Application Priority Data

Dec. 6, 2022    (TW) .................................. 111146680

(51) Int. Cl.
*G11C 29/56*    (2006.01)
(52) U.S. Cl.
CPC .......... *G11C 29/56008* (2013.01); *G11C 2029/5604* (2013.01)
(58) Field of Classification Search
CPC ...... G11C 29/56008; G11C 2029/5604; G06F 18/24
USPC ........................................................ 714/723
See application file for complete search history.

(56) References Cited

U.S. PATENT DOCUMENTS

| 6,408,401 | B1* | 6/2002 | Bhavsar | G11C 29/006 |
| | | | | 714/6.32 |
| 8,030,649 | B2* | 10/2011 | Gschwind | G01R 31/318569 |
| | | | | 365/201 |
| 8,329,713 | B2* | 12/2012 | McNaughton-Smith | |
| | | | | A61P 29/00 |
| | | | | 514/266.3 |
| 8,489,945 | B2* | 7/2013 | Mai | G01R 31/311 |
| | | | | 714/743 |
| 8,713,387 | B2* | 4/2014 | Johnson | G11C 29/44 |
| | | | | 714/708 |

(Continued)

FOREIGN PATENT DOCUMENTS

JP    2005328143 A    * 11/2005

OTHER PUBLICATIONS

"Office Action of Taiwan Counterpart Application", issued on Oct. 4, 2023, p. 1-p. 6.

*Primary Examiner* — Albert Decady
*Assistant Examiner* — Enam Ahmed
(74) *Attorney, Agent, or Firm* — JCIPRNET (57) ABSTRACT

A failure analysis and detection method for a memory is configured to perform abnormal bit detection on a memory. The failure analysis and detection method includes: coordinates are marked on a detection area of the memory, and the coordinates are associated with layout design or a process of the detection area; a MOD function is used to perform classification according to regularity of the coordinates, and the MOD function is a function for getting remainder; and failure information corresponding to the classification is obtained from a failure bitmap (FBM) of the detection area, and the failure information includes a failure cause corresponding to the layout design or the process.

11 Claims, 12 Drawing Sheets

(56) References Cited

U.S. PATENT DOCUMENTS

| | | | |
|---|---|---|---|
| 9,006,003 B1 * | 4/2015 | Luoh | H01L 22/14 |
| | | | 702/59 |
| 2001/0005329 A1 * | 6/2001 | Tamura | G11C 5/06 |
| | | | 365/185.05 |
| 2005/0030055 A1 | 2/2005 | Tran et al. | |
| 2009/0259896 A1 * | 10/2009 | Hsu | G06F 11/1068 |
| | | | 714/E11.147 |
| 2012/0182776 A1 | 7/2012 | Best et al. | |
| 2013/0219216 A1 | 8/2013 | Huang et al. | |

\* cited by examiner

| 1-Bit(XeYe) | 42861 items | | 1-Bit(GG) | 78191 items |
|---|---|---|---|---|
| 1-Bit(XeYo) | 35484 items | → | 1-Bit(CG) | 448 items |
| 1-Bit(XoYo) | 311 items | | 1-Bit(GC) | 154 items |
| 1-Bit(XoYe) | 310 items | | 1-Bit(CC) | 173 items |

| BLp_Core | 0 items |
|---|---|
| BLp_Gap | 71 items |

FAILURE ANALYSIS AND DETECTION METHOD FOR MEMORY

CROSS-REFERENCE TO RELATED APPLICATION

This application claims the priority benefit of Taiwan application serial no. 111146680, filed on Dec. 6, 2022. The entirety of the above-mentioned patent application is hereby incorporated by reference herein and made a part of this specification.

BACKGROUND

Technical Field

The disclosure relates to a failure analysis and detection technology for a memory, and in particular to a failure analysis and detection method for a memory that uses mathematical operations to classify abnormal coordinates, and combines with various mathematical combination and arrangement results obtained from the design and the layout of process capabilities, so as to determine the main cause of an abnormality.

Description of Related Art

Currently, a failure bitmap (FBM) is a commonly used failure analysis system for semiconductor elements. The FBM failure analysis system shows the analysis results of each unit of the memory on the display, such as normal or failure messages according to the layout of the semiconductor memory unit array.

However, the failure messages displayed by the FBM failure analysis system currently used in the industry basically only shows the most basic classification in the system, and there is no classification according to the product design/layout/process and other related characteristics. Even if the failure area is found, tedious and time-consuming failure analysis (FA) still needs to be executed.

SUMMARY

The disclosure provides a failure analysis and detection method for a memory and a corresponding computer-readable medium, which may classify abnormal Bits of related characteristics such as design/layout/process, and combine classification results with the design and the layout to predict or determine the main cause of an abnormality in order to speed up the time for analysis.

The failure analysis and detection method for the memory of the disclosure is configured for abnormal bit detection of the memory. The failure analysis and detection method includes: coordinates are marked on a detection area of the memory, and the coordinates are associated with layout design or a process of the detection area; a MOD function is used to perform classification according to regularity of the coordinates, and the MOD function is a function for getting remainder; and failure information corresponding to the classification is obtained from a failure bitmap (FBM) of the detection area, and the failure information includes a failure cause corresponding to the layout design or the process.

In an embodiment of the disclosure, the above-mentioned classification includes classifying the results of a single bit failure displayed in the FBM into a one-bit (1-Bit) failure, and the coordinates are expressed as (X,Y), in which X represents a first direction, and Y represents a second direction.

In an embodiment of the disclosure, the above-mentioned one-bit failure includes 1-Bit(XeYe), 1-Bit(XoYo), 1-Bit(XoYe), and 1-Bit(XeYo), in which e represents an even number in the coordinates and o represents an odd number in the coordinates.

In an embodiment of the disclosure, the above-mentioned detection area is a detection area after two photolithography processes of multiple patterning, and the above-mentioned one-bit failure includes 1-Bit(CC), 1-Bit(CG), 1-Bit(GC), and 1-Bit(GG), in which CC represents a portion including one core formed by a first photolithography process and another core formed by a second photolithography process, CG represents a portion including one core formed by the first photolithography process and one gap formed by the second photolithography process, GC represents a portion including one gap formed by the first photolithography process and one core formed by the second photolithography process, and GG represents a portion including one gap formed by the first photolithography process and another gap formed by the second photolithography process.

In an embodiment of the disclosure, the above-mentioned detection area is a detection area after two photolithography processes of line multiple patterning, and the above-mentioned one-bit failure includes 1-Bit(Core Space) and 1-Bit(Space Core), in which Core Space represents a portion including a core formed by a first photolithography process and a space formed by a second photolithography process, and Space Core represents a portion including a space formed by the first photolithography process and a core formed by the second photolithography process.

In an embodiment of the disclosure, the above-mentioned classification includes classifying the results of a two-bit failure displayed in the FBM into a two-bit (2-Bit) failure, and the coordinates are expressed as (X,Y), in which X represents the first direction, and Y represents the second direction.

In an embodiment of the disclosure, the above-mentioned memory is dynamic random access memory (DRAM), and the above-mentioned two-bit failure includes 2-Bit(STI), 2-Bit(BLC), 2-Bit(plug), and 2-Bit(SN), in which STI represents a failure caused by an active area short (AA short), BLC represents a failure caused by a bit line contact open, plug represents a failure caused by a plug short, and SN represents a failure caused by a storage node short.

In an embodiment of the disclosure, the above-mentioned detection area is a multiple patterning area of a Flash word line (WL), and the above-mentioned two-bit failure includes a short circuit caused by the core and a short circuit caused by the space.

In an embodiment of the disclosure, the above-mentioned detection area is a multiple patterning area of a DRAM bit line (BL), and the above-mentioned two-bit failure includes 2-Bit(Core) and 2-Bit(Gap), in which Core represents a failure caused by a Core area and Gap represents a failure caused by a Gap area.

In an embodiment of the disclosure, the above-mentioned detection area is a detection area after two photolithography processes of multiple patterning, and the above-mentioned classification includes classifying a bit line pair (BLp) that shows two continuous line failures in the FBM into a core part and a gap part.

In an embodiment of the disclosure, the above-mentioned detection area is a sense amplifier (SA) area of the DRAM, and the above-mentioned classification includes classifying the results showing two line failures in the FBM into SAs_6,e and SAs_7,f if the contact shift occurs at the coordinates being (6,e) and (7,f).

A computer-readable medium of the disclosure is a computer-readable medium with a built-in program. After a computer loads and executes the program, the above-mentioned failure analysis and detection method for the memory may be completed.

Based on the above, the disclosure uses the coordinates associated with the layout design or the process marked in the detection area, and then classifies the aforementioned coordinates according to different layout design or processes. Therefore, after the failure analysis of the FBM, the main cause of the abnormality may be effectively found out. Moreover, the method of the disclosure may also be applied to the analysis of multiple patterning to solve the problem that the original FBM cannot directly obtain the root cause of the failure.

In order to make the aforementioned features of the disclosure comprehensible, embodiments accompanied with drawings are described in detail as follows.

DESCRIPTION OF THE EMBODIMENTS

Figure 1:
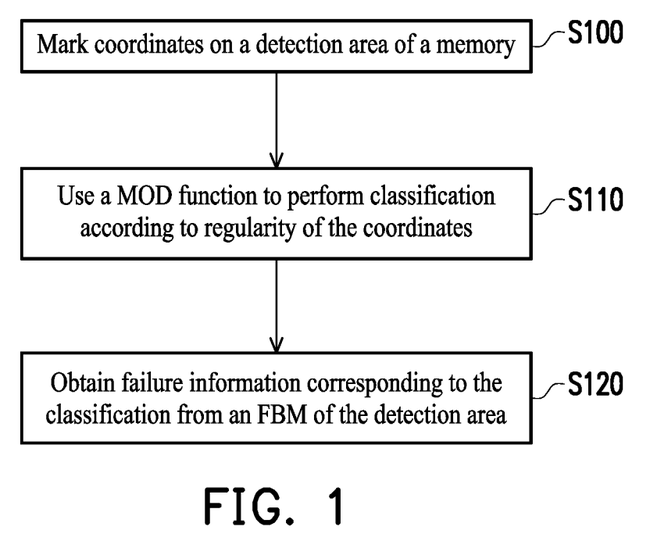
FIG. 1 is a flowchart of a failure analysis and detection method for a memory according to an embodiment of the disclosure.

FIG. 1 is a flowchart of a failure analysis and detection method for a memory according to an embodiment of the disclosure.

Firstly, in step S100, coordinates are marked on a detection area of a memory, that is, all bits in the detection area are marked as (X,Y), in which X represents a first direction, and Y represents a second direction. The coordinates are associated with layout design or a process of the detection area. For example, the following various parts of the memory are all repeating at specific positions within the detection area and have regularity, such as a word line (WL), a bit line (BL), a storage node (SN), shallow trench isolation (STI), a bit line contact (BLC), a conductive plug (plug), a circuit produced by multiple patterning, a floating gate (FG), etc. Therefore, in step S110, a MOD function may be used to perform classification according to the above-mentioned regularity of the coordinates, and the MOD function is a function for getting the remainder. Various examples of the classification are described in detail below.

Next, in step S120, failure information corresponding to the classification is obtained from a failure bitmap (FBM) of the detection area, and the failure information includes failure causes corresponding to the layout design or the process, for example, for the circuit produced by multiple patterning, it may be found whether a failure occurs in a first photolithography process or in a second photolithography process, and thus, the cause of the error can be quickly found out, such as dimension unequal of a core in the first photolithography process, etc., and the "core" refers to the part where the photoresist is formed.

Figure 2:
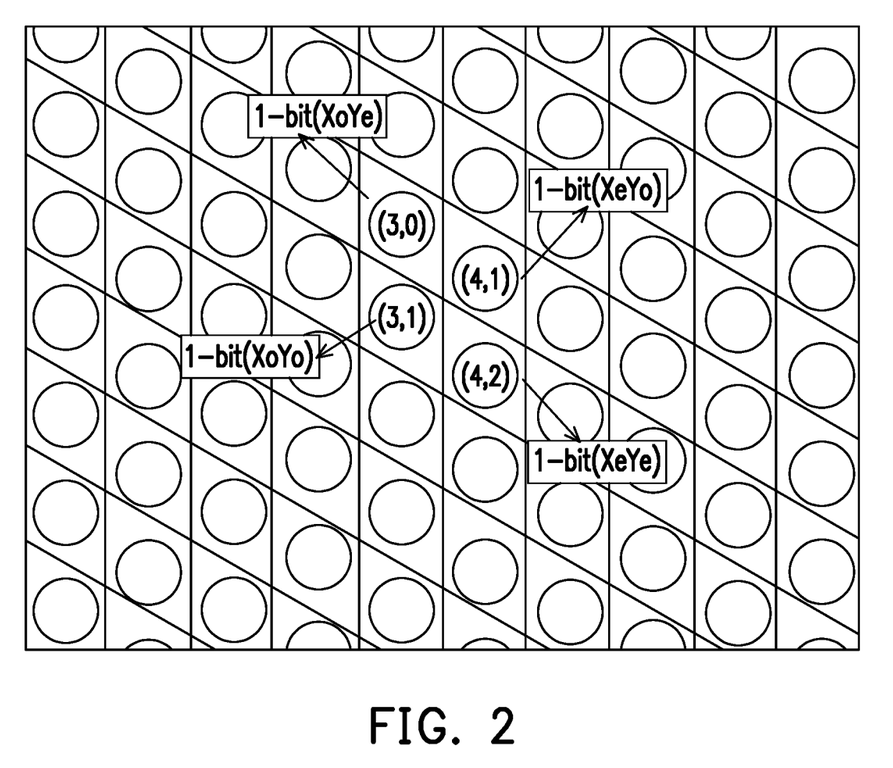
FIG. 2 shows a schematic layout associated with WLs/BLs.

FIG. 2 shows a schematic layout associated with WLs/BLs.

In FIG. 2, all bits are marked as (X,Y), in which X represents the first direction and Y represents the second direction. Taking (3,0), (3,1), (4,1), and (4,2) in the figure as an example, a one-bit (1-Bit) failure may be classified into four quadrants of 1-Bit(XoYe), 1-Bit(XoYo), 1-Bit(XeYo), and 1-Bit(XeYe), in which e represents an even number in the coordinates, and o represents an odd number in the coordinates. If the aforementioned classification is compared with the coordinates, the classification may be displayed as:

1-Bit(XeYe): (2n,2m)
1-Bit(XeYo): (2n,2m+1)
1-Bit(XoYe): (2n+1,2m)
1-Bit(XoYo): (2n+1,2m+1)

The above n and m are each independently 0 or an integer greater than 0.

Therefore, the coordinates of the parts shown as the 1-Bit failure after the performance of the failure analysis of the FBM may be directly classified according to the regularity of the above coordinates by using the MOD function. For example, if the bit with the coordinates (3,0) indicates a failure, then 3 divided by 2, remainder 1 (X is an odd number), 0 divided by 2 is 0 (Y is an even number), and the classification is displayed as 1-Bit(XoYe). According to the failure information corresponding to 1-Bit(XoYe), the cause of the failure may be deduced.

Figure 3A:
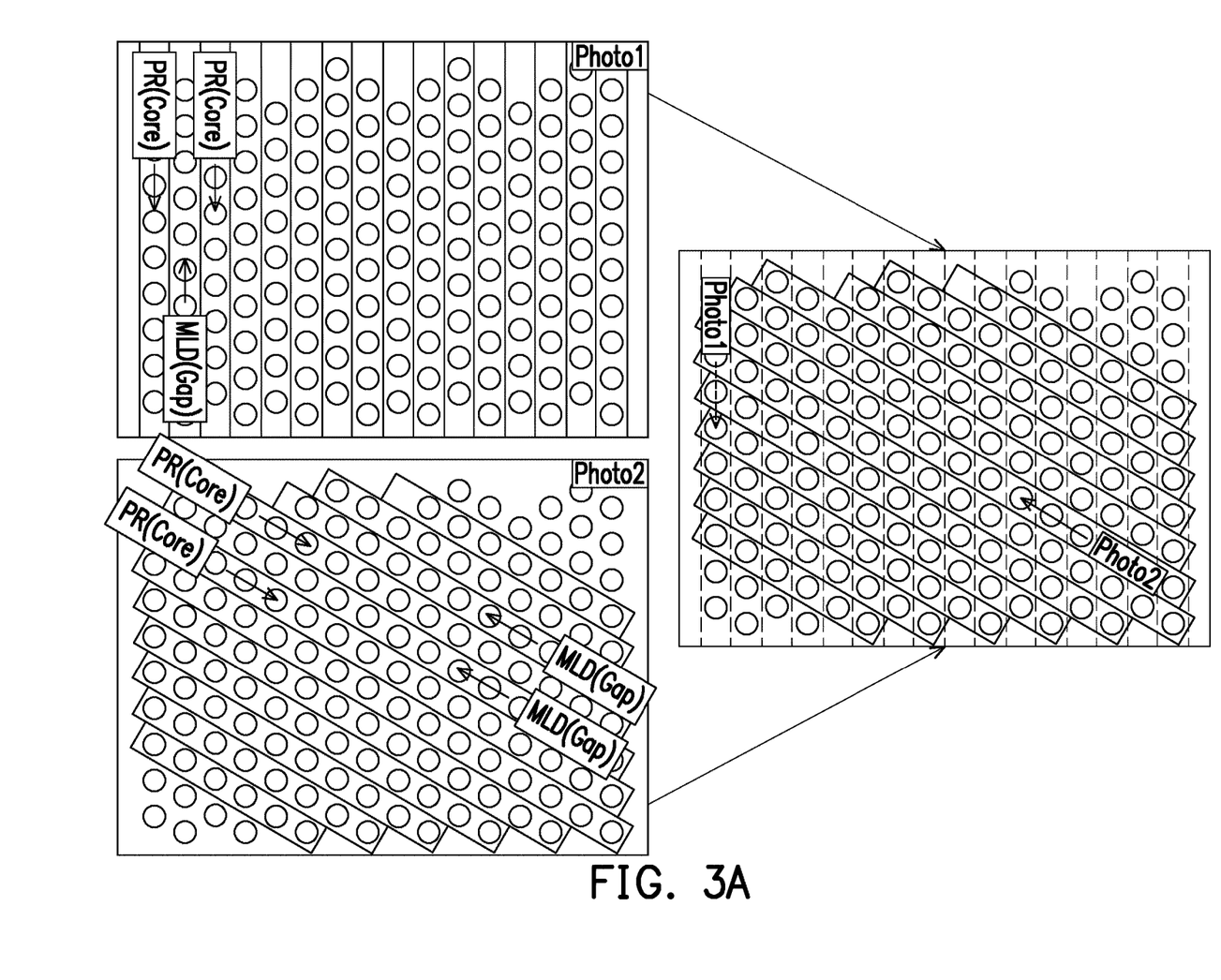
FIG. 3A shows a schematic layout associated with multiple patterning.
Figure 3B:
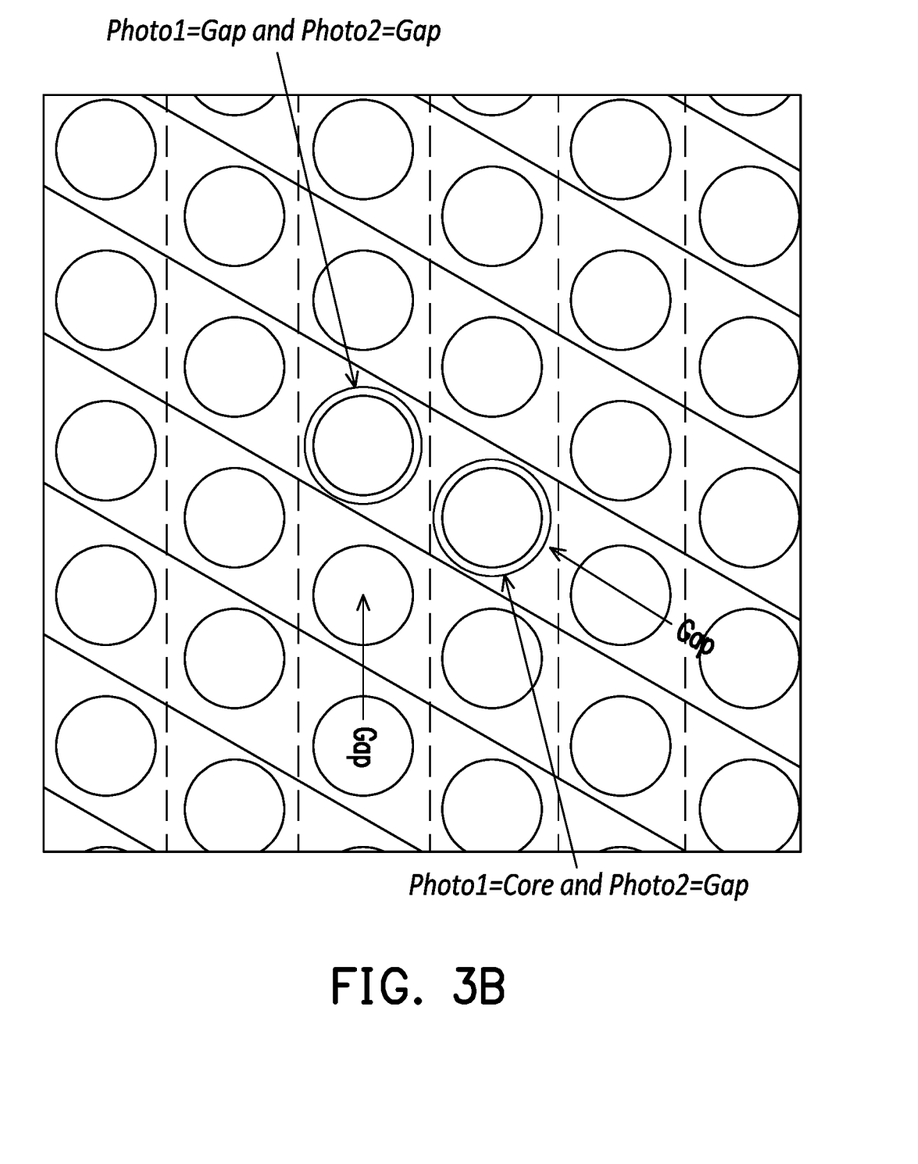
FIG. 3B is a partially enlarged view of FIG. 3A.

FIG. 3A shows a schematic layout associated with multiple patterning. FIG. 3B is a partially enlarged view of FIG. 3A.

In FIG. 3A, the two layout diagrams on the left represent the layout diagrams of two photolithography processes of multiple patterning, respectively, and the diagram on the right is the layout diagram after a multiple patterning process is completed. The two layout diagrams on the left have different exposure directions, and an exposure direction marked as Photo1 is vertical; an exposure direction marked as Photo2 and the exposure direction of Photo1 form an acute angle. In FIG. 3A, the alternate layout of one row of PR(Core) and one row of MLD(Gap) is taken as an example, but the disclosure is not limited thereto. In the disclosure, "Core" refers to the part where the photoresist is formed, and "Gap" refers to the space or the part between the photoresist and the photoresist.

FIG. 3B shows a partially enlarged view of the layout diagram after the multiple patterning process is completed, in which the same position may be the same part or different parts of the two photolithography processes. For example, the two circles marked with arrows in the figure, one is the Gap part of Photo1 with the Gap part of Photo2, and the other is the Core part of Photo1 with the Gap part of Photo2.

Figure 4:
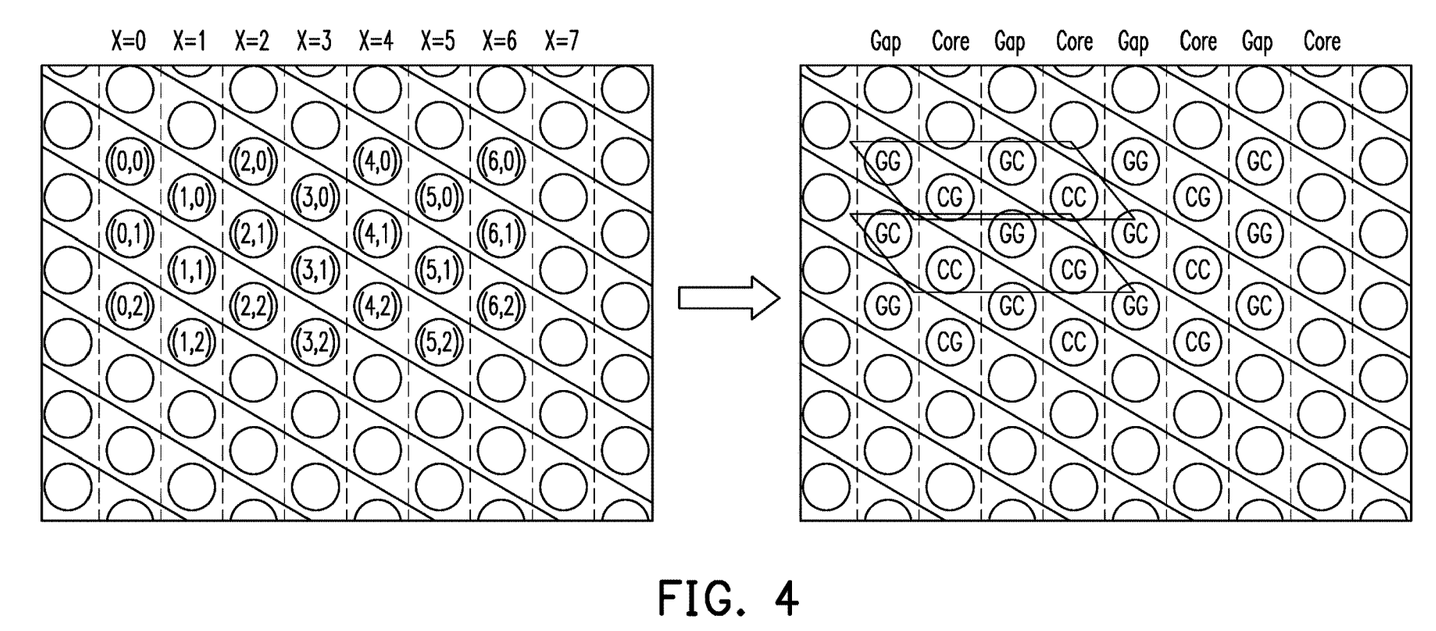
FIG. 4 is a schematic diagram showing a coordinate transformation associated with the multiple patterning process.

FIG. 4 is a schematic diagram showing a coordinate transformation associated with the multiple patterning process.

In FIG. 4, the layout diagram on the left is basically the same as FIG. 3B, and coordinates are marked on the figure, that is, all bits in the detection area are marked as (X,Y), in which X represents the first direction and Y represents the second direction. Taking the multiple coordinates shown in the figure as an example, the one-bit failure may be classified into 1-Bit(CC), 1-Bit(CG), 1-Bit(GC), and 1-Bit(GG), in which CC represents a portion including one core formed by a first photolithography process and another core formed by a second photolithography process, CG represents a portion including one core formed by the first photolithography process and one gap formed by the second photolithography process, GC represents a portion including one gap formed by the first photolithography process and one core formed by the second photolithography process, and GG represents a portion including one gap formed by the first photolithography process and another gap formed by the second photolithography process. The aforementioned classification is obtained according to the layout associated with the process, four bits per cycle, as shown in the area enclosed by the quadrilaterals in the layout on the right of FIG. 4. If the aforementioned classification is compared with the coordinates, the classification may be displayed as:

1-Bit(GG): (4n,2m), (4n+2,2m+1)
1-Bit(CG): (4n+1,2m), (4n+3,2m+1)
1-Bit(GC): (4n,2m+1), (4n+2,2m)
1-Bit(CC): (4n+3,2m), (4n+1,2m+1)

The above n and m are each independently 0 or an integer greater than 0.

For example, if the bit with the coordinates (3,0) indicates a failure, then 3 divided by 4, remainder 3, 0 divided by 4 is 0, and the classification is displayed as 1-Bit(CC).

However, if the layout corresponding to the process is changed, the repeated areas in the layout also change. Similarly, according to changes in element design/layout, the coordinates compared with each of the classification also change.

In the disclosure, the above-mentioned multiple patterning process may include but not limited to double patterning (DPT), self-aligned double patterning (SADP), self-aligned reverse imaging (SARP), etc.

The following three FBMs obtained by using a tester for failure analysis after the multiple patterning process are listed as examples to illustrate the analysis and detection method of the disclosure applied to the multiple patterning process.

Figure 5A:
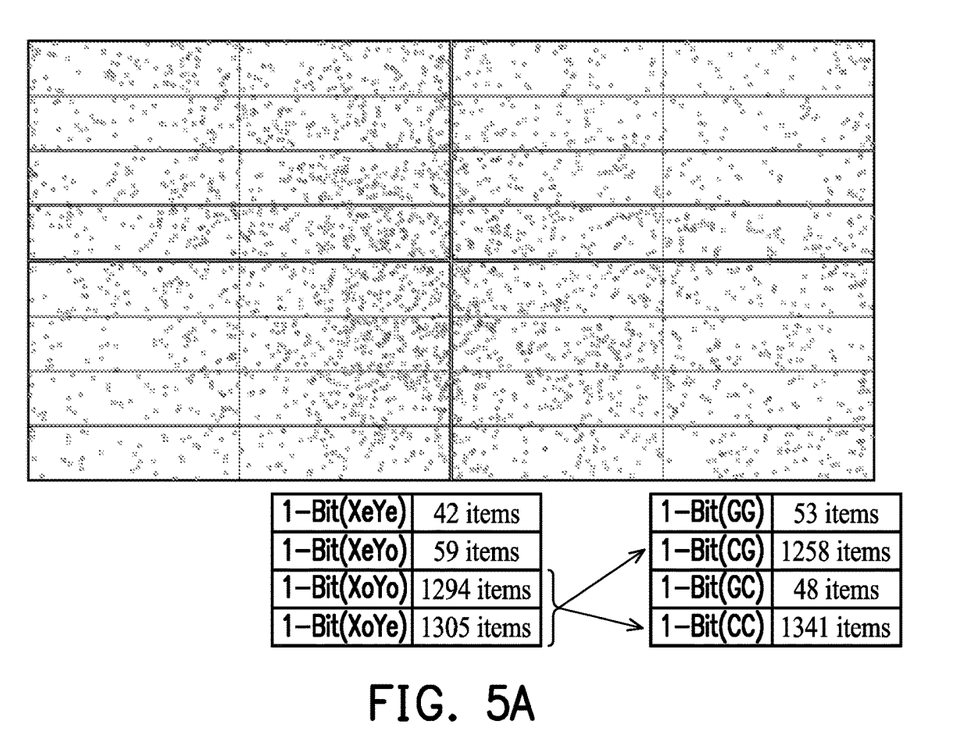
FIG. 5A is a first FBM diagram of detection of the memory after the multiple patterning process.

The first FBM is shown in FIG. 5A. If the classification is not associated with the layout design or the process of the detection area, the classification is like the table on the left, which only shows that the number of failure items of 1-Bit(XoYo) and 1-Bit(XoYe) is obviously high, but the root cause of the failure cannot be obtained. After the above-mentioned coordinate marking and classification associated with the process, the table on the right may be obtained, which shows that the number of failure items of 1-Bit(CG) and 1-Bit(CC) is relatively high, and both of the items have C indicating the portion with the core formed by the first photolithography process. Therefore, it may be obtained that a problem in the portion where the core is formed may occur in the first photolithography process.

Figure 5B:
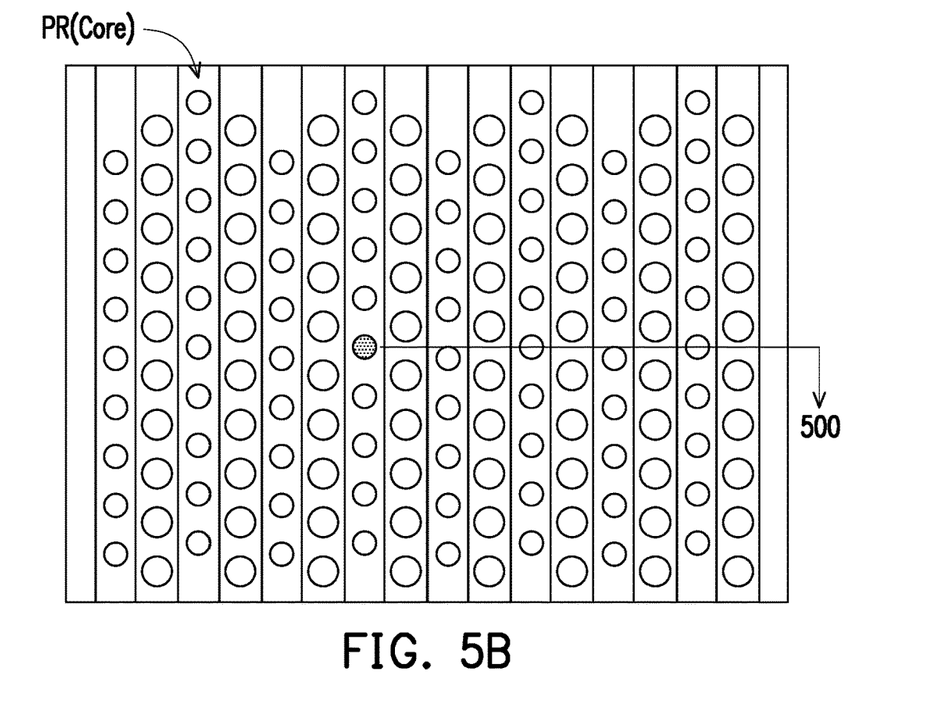
FIG. 5B shows a schematic layout of a detection area corresponding to FIG. 5A.

Next, through subsequent core detection (such as FA failure analysis) in the layout of the first photolithography process, a schematic layout as shown in FIG. 5B may be obtained, in which a problem that core 500 formed by the first photolithography process is too small is found.

Figure 6A:
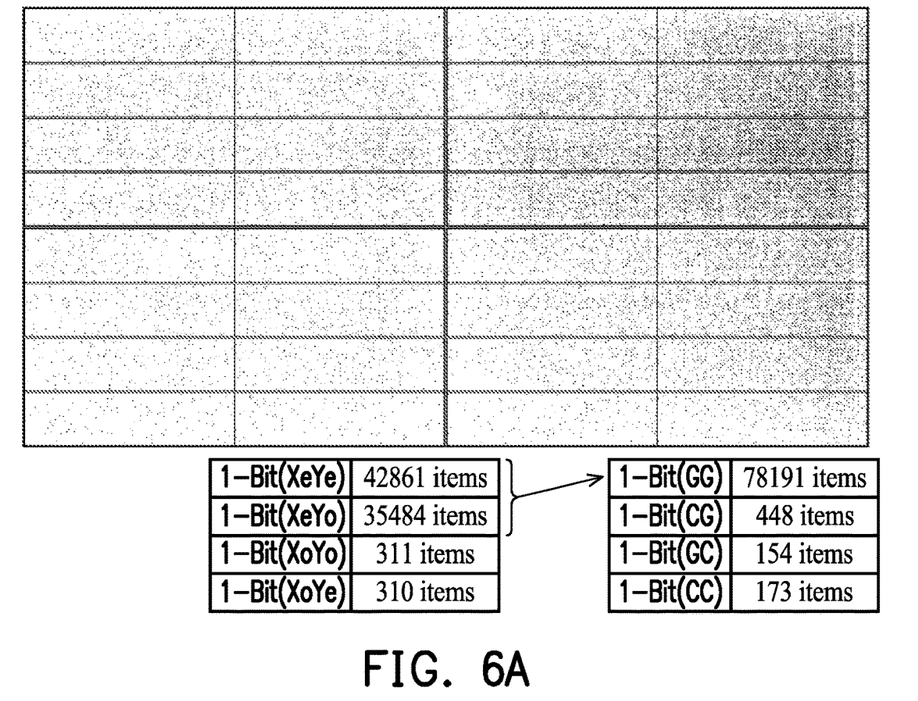
FIG. 6A is a second FBM diagram of the detection of the memory after the multiple patterning process.

The second FBM is shown in FIG. 6A. The table on the left only shows that the number of failure items of 1-Bit(XeYe) and 1-Bit(XeYo) is obviously high, but the root cause of the failure cannot be obtained. After the above-mentioned coordinate marking and classification associated with the process, the table on the right may be obtained, which shows that the number of failure items of 1-Bit(GG) is relatively high. Therefore, it may be obtained that a problem in the part where the gap is formed may occur in the first photolithography process and the second photolithography process.

Figure 6B:
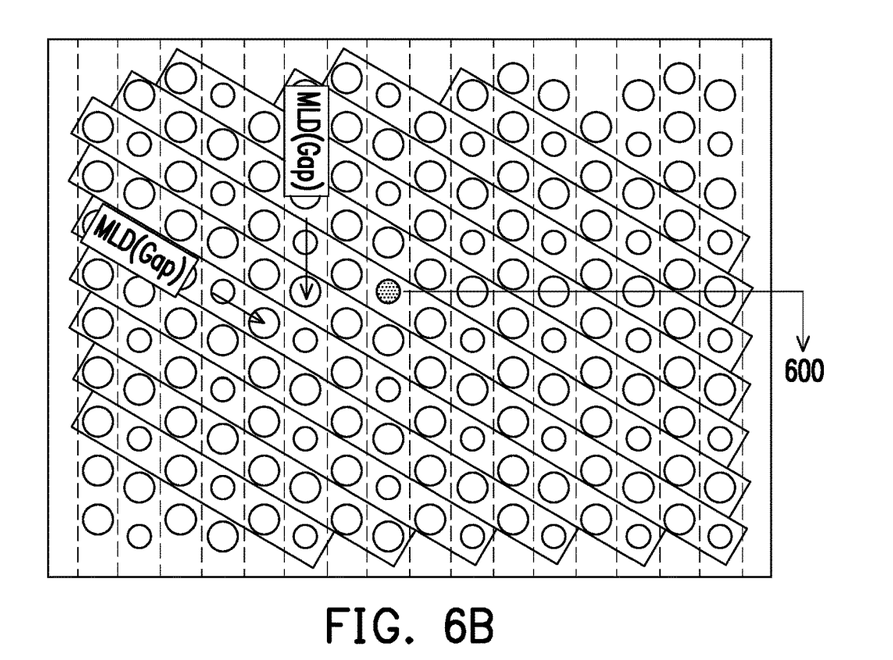
FIG. 6B shows a schematic layout of the detection area corresponding to FIG. 6A.

Next, through subsequent gap detection in the layout of the first photolithography process and the second photolithography process, a schematic layout as shown in FIG. 6B may be obtained, in which a problem that gap 600 formed by the first photolithography process and the second photolithography process is too small is found.

Figure 7A:
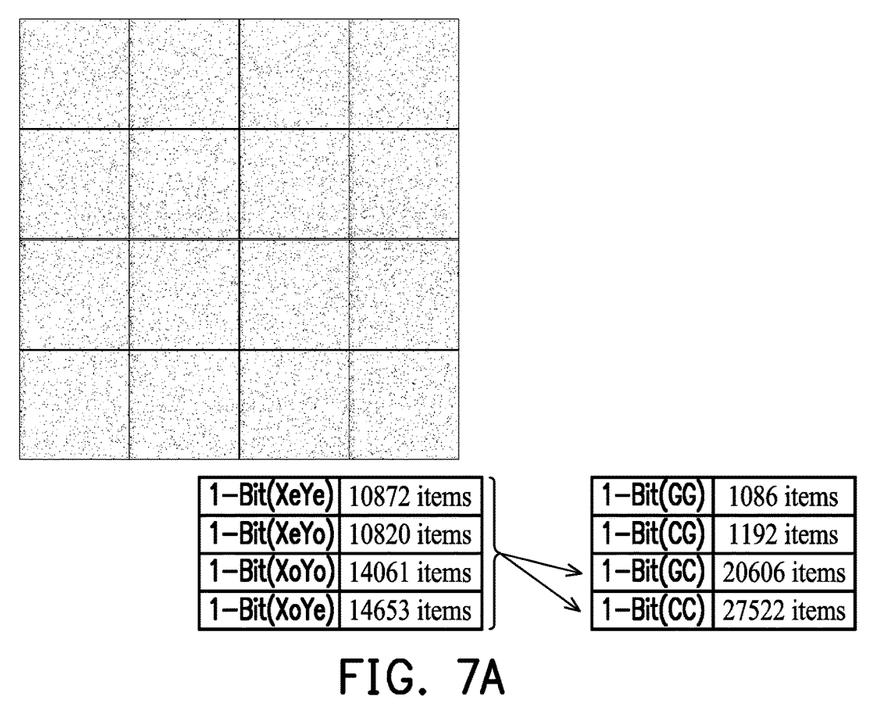
FIG. 7A is a third FBM diagram of the detection of the memory after the multiple patterning process.

The third FBM is shown in FIG. 7A. The root cause of the failure cannot be obtained from the table on the left because each classification has 10,000 and above failure items. After the above-mentioned coordinate marking and classification associated with the process, the table on the right may be obtained, in which shows that the number of failure items of 1-Bit(GC) and 1-Bit(CC) is relatively high, and both of the items have C indicating the portion with the core formed by the second photolithography process. Therefore, it may be obtained that a problem in the portion where the core is formed may occur in the second photolithography process.

Figure 7B:
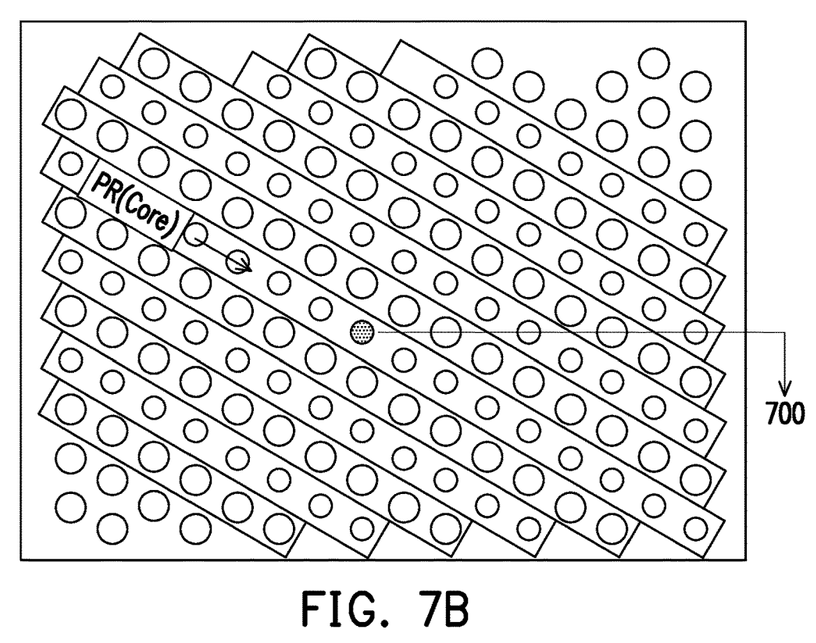
FIG. 7B shows a schematic layout of the detection area corresponding to FIG. 7A.

Next, through subsequent core detection in the layout of the second photolithography process, a schematic layout as shown in FIG. 7B may be obtained, in which a problem that core 700 formed by the second photolithography process is too small is found.

In addition to the above classification, the coordinate transformation associated with the multiple patterning process may further be applied to a detection area after two photolithography processes of line multiple patterning, and classify the one-bit failure as 1-Bit(Core Space) and 1-Bit (Space Core), in which Core Space represents a portion including a core formed by a first photolithography process and a space formed by a second photolithography process, and Space Core represents a portion including a space formed by the first photolithography process and a core formed by the second photolithography process. If the aforementioned classification is compared with the coordinates, the classification may be displayed as:

1-Bit(Core Space): (2n+1,2m), (2n+1,2m+1)
1-Bit(Space Core): (2n,2m+1), (2n,2m)
The above n and m are each independently 0 or an integer greater than 0.

As for the results of a two-bit failure (2-Bit) displayed in the FBM, the following classification may be made.

Figure 8A:
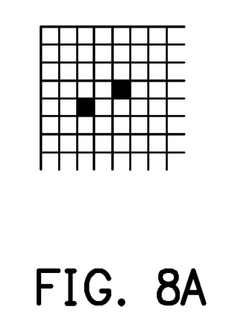
FIG. 8A shows a schematic diagram of an FBM corresponding to STI of dynamic random access memory (DRAM).
Figure 8B:
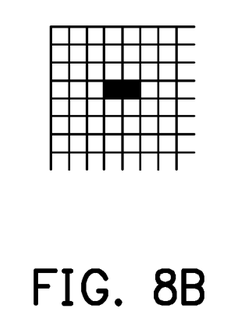
FIG. 8B shows a schematic diagram of an FBM corresponding to BLC of the DRAM.
Figure 8C:
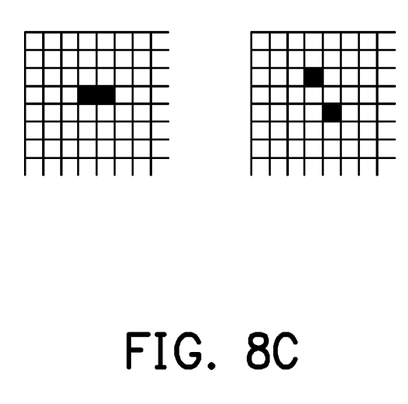
FIG. 8C shows two schematic diagrams of FBMs corresponding to Plug of the DRAM.
Figure 8D:
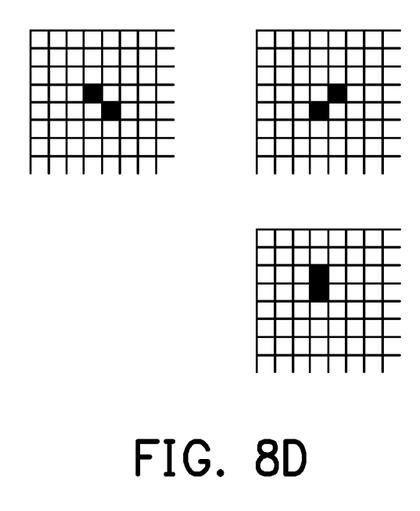
FIG. 8D shows three schematic diagrams of FBMs corresponding to SN of the DRAM.

FIG. 8A shows a schematic diagram of an FBM corresponding to STI of dynamic random access memory (DRAM). FIG. 8B shows a schematic diagram of an FBM corresponding to BLC of the DRAM. FIG. 8C shows two schematic diagrams of FBMs corresponding to Plug of the DRAM. FIG. 8D shows three schematic diagrams of FBMs corresponding to SN of the DRAM.

Therefore, the two-bit failure includes 2-Bit(STI), 2-Bit(BLC), 2-Bit(plug), and 2-Bit(SN), in which, STI represents a failure caused by an AA short, BLC represents a failure caused by a BLC open, plug represents a failure caused by a plug short, and SN represents a failure caused by a storage node short. If the aforementioned classification is compared with the coordinates, the classification may be displayed as:

2-Bit(STI): (2n+1,2m) & (2n+3,2m+1); (2n,2m+1) & (2n+2,2m+2)
2-Bit(BLC): (2n+1,2m+1) & (2n+1,2m+1); (2n,2m) & (2n+2,2m)
2-Bit(plug): (n,m) & (n+1,m); (n,m) & (n+1,m+2)
2-Bit(SN): (n,m) & (n+1,m+1); (n,m) & (n+1,m−1); (2n+1,2m) & (2n+1,2m+1); (2n,2m+1) & (2n,2m+2)
The above n and m are each independently 0 or an integer greater than 0.

Furthermore, the classification of the two-bit failure may also be applied to an analysis and detection method associated with the multiple patterning process. For example, if the detection area is a multiple patterning area of a Flash WL, the above-mentioned two-bit failure may be classified into a short circuit caused by the core (Core induce Short) and a short circuit caused by the space (Space induce Short). If the aforementioned classification is compared with the coordinates, the classification may be displayed as:

Core induce Short: (2n,m) & (2n+1,m)
Space induce Short: (2n+1,m) & (2n+2,m)
The above n and m are each independently 0 or an integer greater than 0.

Figure 9:
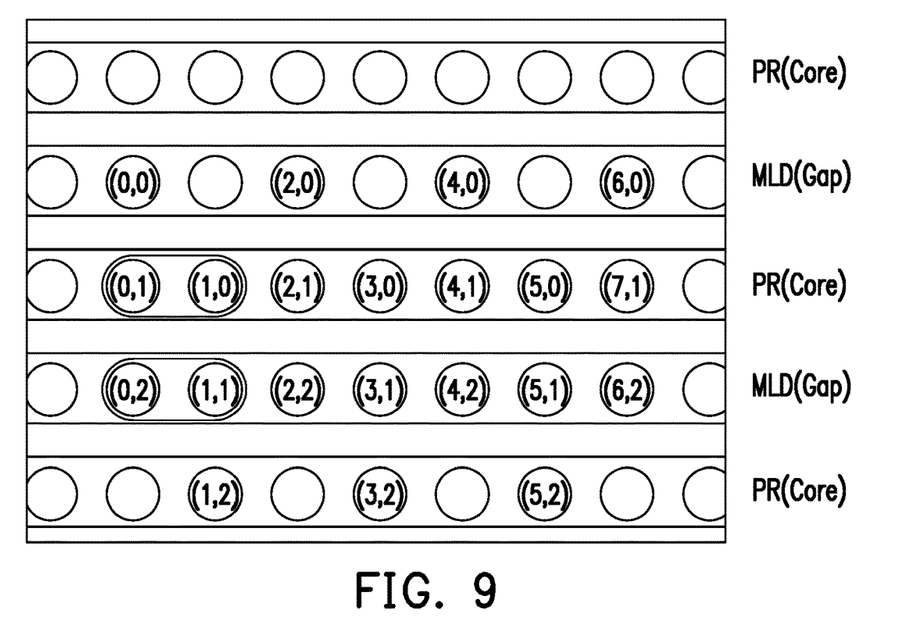
FIG. 9 shows a schematic layout associated with a multiple patterning area of a DRAM 2-Bit.

On the other hand, if the detection area is a multiple patterning area of a DRAM 2-bit, a schematic layout is shown in FIG. 9, in which all bits are marked as (X,Y), X represents the first direction, and Y represents the second direction. The two-bit failure may be classified into 2-Bit (Core) and 2-Bit(Gap), in which Core represents a failure caused by a Core area and Gap represents a failure caused by a Gap area. If the aforementioned classification is compared with the coordinates, the classification may be displayed as:

2-Bit(Core): (2n,2m+1) & (2n+1,2m)
2-Bit(Gap): (2n,2m) & (2n+1,2m+1)
The above n and m are each independently 0 or an integer greater than 0.

For example, if FIG. 9 shows failure bit coordinates (0,1) and (1,0) at the same time, then a first coordinate is 0 divided by 2, remainder 0, 1 divided by 2, remainder 1, and a second coordinate is 1 divided by 2, remainder 1, 0 divided by 2, remainder 0, and the classification is displayed as 2-Bit (Core); if the failure bit coordinates are displayed as (0,2) and (1,1) at the same time, then 0 divided by 2, remainder 0, 2 divided by 2, remainder 0, and 1 divided by 2, remainder 1, 1 divided by 2, remainder 1, and the classification is displayed as 2-Bit(Gap).

Figure 10:
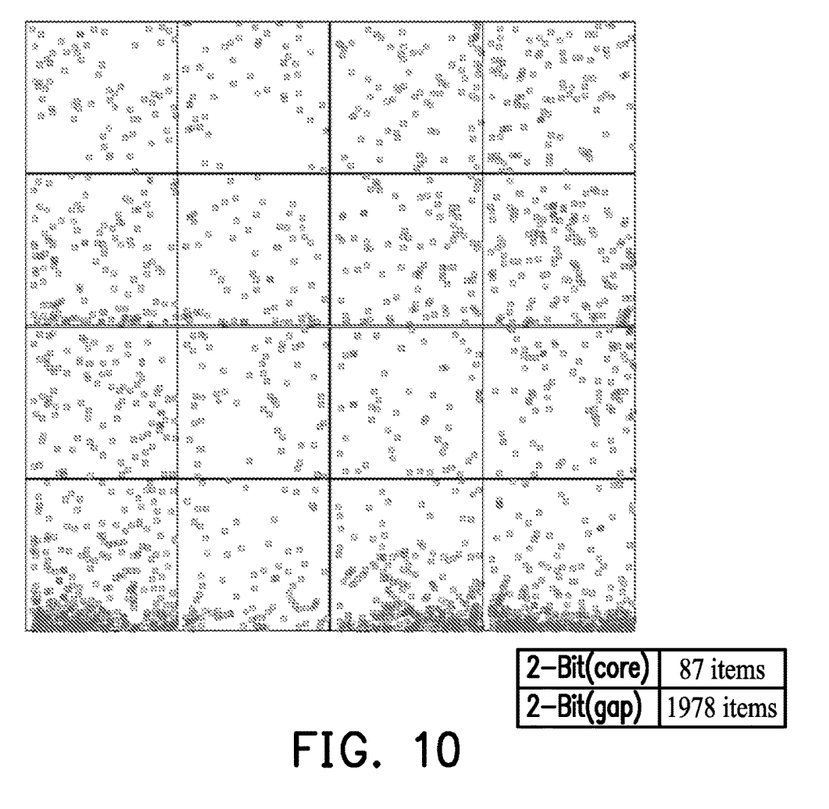
FIG. 10 is an FBM diagram obtained by performing failure analysis on the multiple patterning area of the DRAM 2-Bit.

Therefore, if an FBM shown in FIG. 10 is obtained after the failure analysis of the multiple patterning area of the DRAM 2-bit, it may be obtained that the number of failure items showing 2-Bit(Gap) in the table is relatively high. Therefore, it may be obtained that a problem in the Gap area may occur.

Figure 11:
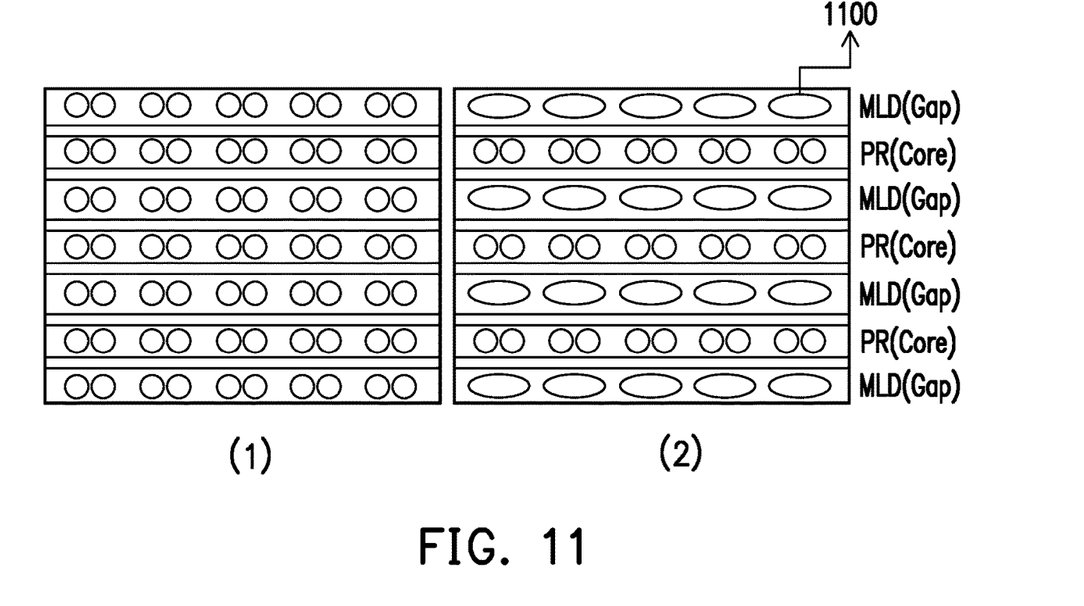
FIG. 11 is a schematic diagram corresponding to (1) a normal layout and (2) an abnormal layout of the detection area in FIG. 10.

Next, through subsequent gap detection in the layout, a schematic layout as shown in FIG. 11 may be obtained. Diagram (1) on the left is a normal layout, and diagram (2) on the right is an abnormal layout. It may be found that gap 1100 is connected and causes a short circuit problem.

In addition, the FBM shows the results of a line failure and may be classified as follows.

Figure 12:
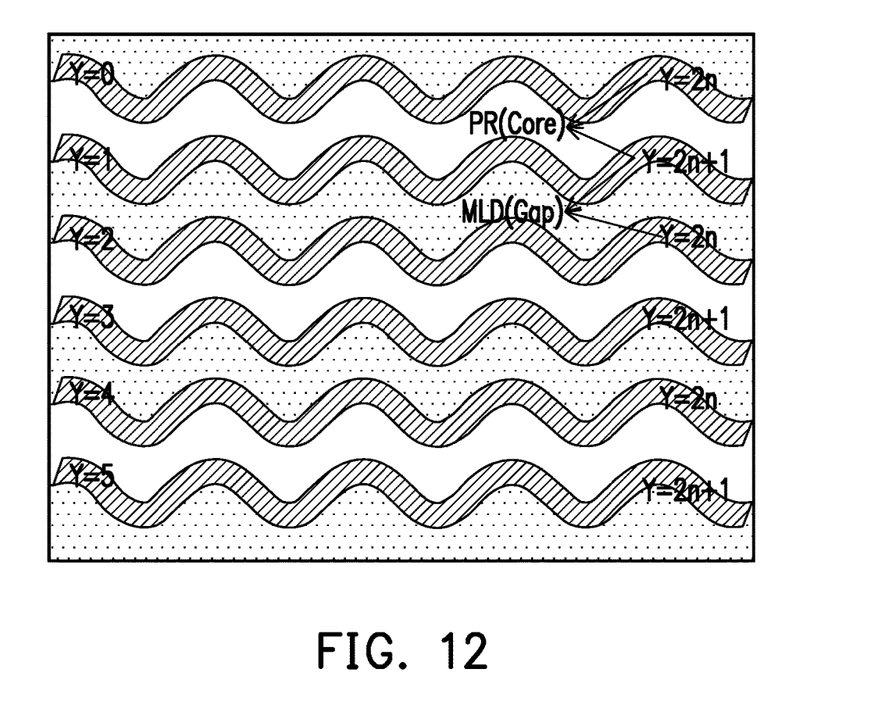
FIG. 12 shows a schematic layout associated with multiple patterning of a DRAM BL.

FIG. 12 shows a schematic layout associated with multiple patterning of a DRAM BL. In FIG. 12, all bits in the detection area are marked as (X,Y), in which X represents an extending direction of a line segment (the first direction), and Y represents the second direction. Taking the coordinates shown in the figure as an example, a bit line pair (BLp) showing two continuous line failures in the FBM may be classified into a Core part (BLp_Core) and a Gap part (BLp_Gap). If the aforementioned classification is compared with the coordinates, the classification may be displayed as:

BLp_Core: (0~687,2n) & (0~687,2n+1)
BLp_Gap: (0~687,2n+1) & (0~687,2n+2)
The above n is 0 or an integer greater than 0.

Therefore, two FBMs after failure analysis are taken as examples below to illustrate a line failure analysis and detection method applied to the multiple patterning of the DRAM BL.

Figure 13A:
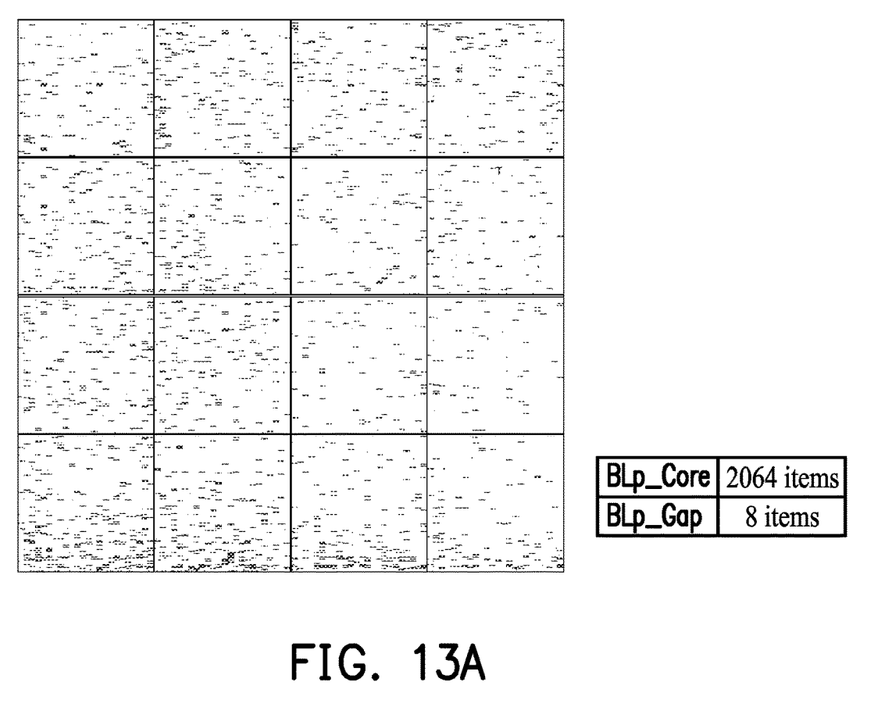
FIG. 13A is an FBM diagram obtained from line failure detection of the multiple patterning of the DRAM BL.

The first FBM is shown in FIG. 13A. It may be obtained that the number of failure items of BLp_Core shown in the table is relatively high so the root cause of the failure here may be caused by a core short circuit.

Figure 13B:
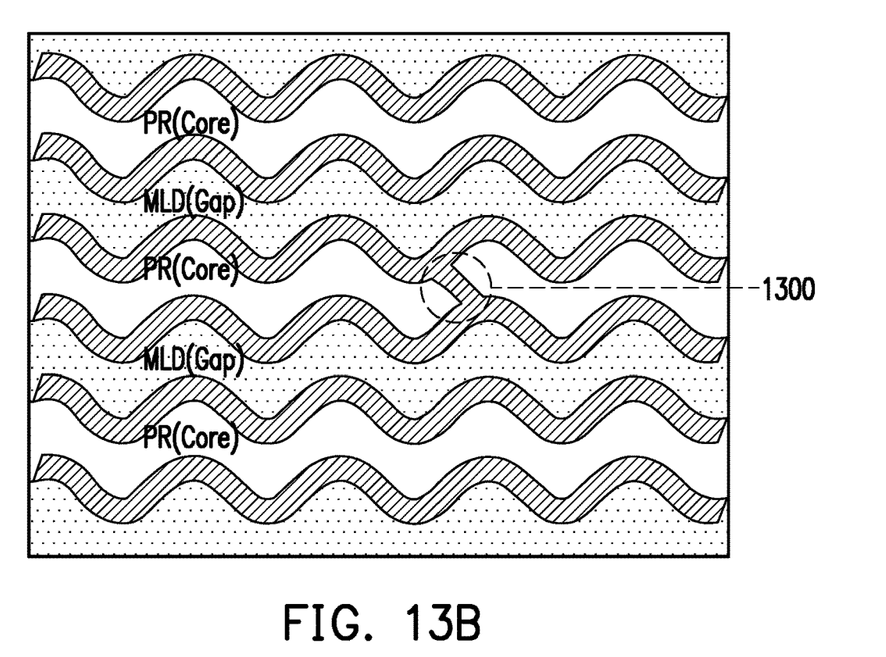
FIG. 13B is a schematic diagram of an abnormal layout of the detection area corresponding to FIG. 13A.

Next, through subsequent detection and analysis of the core in the layout, a schematic diagram of an abnormal layout as shown in FIG. 13B is obtained. It may be found that a short circuit phenomenon exists in PR(Core) 1300, which is suspected to be a failure caused by a photoresist (PR) residue.

Figure 14A:
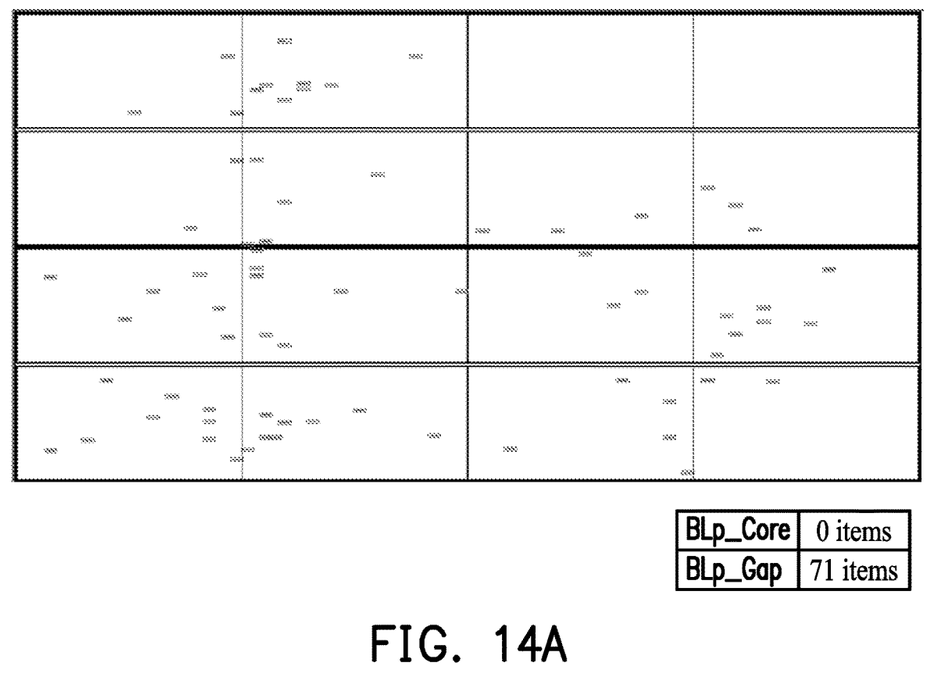
FIG. 14A is another FBM diagram obtained from the line failure detection of the multiple patterning of the DRAM BL.

The second FBM is shown in FIG. 14A. It may be obtained that BLp_Gap has the largest number of failure items in the table so the root cause of the failure here may be caused by a gap short circuit.

Figure 14B:
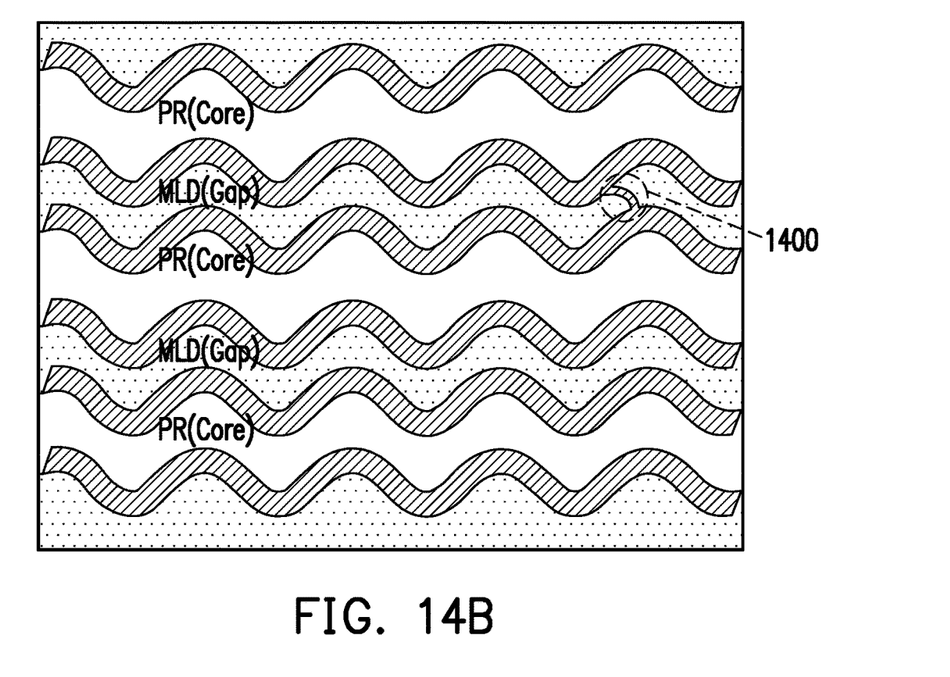
FIG. 14B is a schematic diagram of the abnormal layout of the detection area corresponding to FIG. 14A.

Next, through subsequent detection and analysis of the Gap in the layout, a schematic diagram of the abnormal layout as shown in FIG. 14B is obtained. It may be found that a short circuit phenomenon exists in MLD(Gap) 1400, which is suspected to be a failure caused by pitch unequal of the Gap.

In addition, when the detection area is a sense amplifier (SA) area of the DRAM, if the contact shift occurs at the specific coordinates (6,e) and (7,f), the classification of the line failure shown in the FBM shows SAs_6,e and SAs_7,f, and the corresponding coordinates may be displayed as:

SAs_6,e: (0~687,8n+6) & (688~1359,8n+6)
SAs_7,f: (0~687,8n+7) & (688~1359,8n+7)
The above n is 0 or an integer greater than 0. SAs is the abbreviation of Sense Amplifier single, and (6,e) and (7,f) are hexadecimal coordinates. However, if the specific coordinates corresponding to the process change, this classification also changes; and so on.

Another aspect of the disclosure relates to a computer-readable medium, and the computer-readable medium internally stores a program, including instructions for testing an integrated circuit. After a computer loads and executes the program, the failure analysis and detection method for the memory of the above-mentioned embodiment may be completed. In an embodiment, the computer is a processor in a test instrument, or a processor connected to the test instrument. In addition, the computer-readable medium may also store the original FBM classification and the detection process, which is adapted for simple element design/process detection.

To sum up, the disclosure classifies abnormal Bits of related characteristics such as the design/layout/process, and combines the classification results with the design and the layout to predict or determine the root cause of the abnormality so the time for subsequent FA failure analysis can be greatly reduced. Moreover, the method of the disclosure may further be applied to the analysis associated with multiple patterning, and solve the problem that the original FBM cannot determine which photolithography process in multiple patterning causes the failure.

Although the disclosure has been described with reference to the above embodiments, the described embodiments are not intended to limit the disclosure. People of ordinary skill in the art may make some changes and modifications without departing from the spirit and the scope of the disclosure. Thus, the scope of the disclosure shall be subject to those defined by the attached claims.

What is claimed is:

1. A failure analysis and detection method for a memory, configured to perform abnormal bit detection on a memory, comprising:
   marking coordinates on a detection area of the memory, wherein the coordinates are associated with layout design or a process of the detection area;
   using a MOD function to perform classification according to regularity of the coordinates, wherein the MOD function is a function for getting remainder; and
   obtaining failure information corresponding to the classification from a failure bitmap (FBM) of the detection area, wherein the failure information comprises a failure cause corresponding to the layout design or the process.

2. The failure analysis and detection method for the memory according to claim 1, wherein the classification comprises classifying results of a single bit failure displayed in the FBM into a one-bit (1-Bit) failure, and the coordinates are expressed as (X,Y), in which X represents a first direction, and Y represents a second direction.

3. The failure analysis and detection method for the memory according to claim 2, wherein the one-bit failure comprises 1-Bit (XeYe), 1-Bit (XoYo), 1-Bit (XoYe), and 1-Bit (XeYo), in which e represents an even number in the coordinates and o represents an odd number in the coordinates.

4. The failure analysis and detection method for the memory according to claim 2, wherein the detection area is a detection area after two photolithography processes of multiple patterning, and the one-bit failure comprises 1-Bit (CC), 1-Bit (CG), 1-Bit (GC), and 1-Bit (GG), in which CC represents a portion including one core formed by a first photolithography process and another core formed by a second photolithography process, CG represents a portion including one core formed by the first photolithography process and one gap formed by the second photolithography process, GC represents a portion including one gap formed by the first photolithography process and one core formed by the second photolithography process, and GG represents a portion including one gap formed by the first photolithography process and another gap formed by the second photolithography process.

5. The failure analysis and detection method for the memory according to claim 2, wherein the detection area is a detection area after two photolithography processes of line multiple patterning, and the one-bit failure comprises 1-Bit (Core Space) and 1-Bit (Space Core), in which Core Space represents a portion including a core formed by a first photolithography process and a space formed by a second photolithography process, and Space Core represents a portion including a space formed by the first photolithography process and a core formed by the second photolithography process.

6. The failure analysis and detection method for the memory according to claim 1, wherein the classification comprises classifying results of a two-bit failure displayed in the FBM into a two-bit (2-Bit) failure, and the coordinates are expressed as (X,Y), in which X represents a first direction, and Y represents a second direction.

7. The failure analysis and detection method for the memory according to claim 6, wherein the memory is dynamic random access memory (DRAM), and the two-bit failure comprises 2-Bit (STI), 2-Bit (BLC), 2-Bit (plug), and 2-Bit (SN), in which STI represents a failure caused by an active area short, BLC represents a failure caused by a bit line contact open, plug represents a failure caused by a plug short, and SN represents a failure caused by a storage node short.

8. The failure analysis and detection method for the memory according to claim 6, wherein the detection area is a multiple patterning area of a Flash word line (WL), and the two-bit failure comprises a short circuit caused by a core and a short circuit caused by a space.

9. The failure analysis and detection method for the memory according to claim 6, wherein the detection area is a multiple patterning area of a DRAM bit line (BL), and the two-bit failure comprises 2-Bit (Core) and 2-Bit (Gap), in which Core represents a failure caused by a core area and Gap represents a failure caused by a gap area.

10. The failure analysis and detection method for the memory according to claim 1, wherein the detection area is a detection area after two photolithography processes of multiple patterning, and the classification comprises classifying a bit line pair showing two continuous line failures in the FBM into a core part and a gap part.

11. The failure analysis and detection method for the memory according to claim 1, wherein the detection area is a sense amplifier (SA) area of DRAM, and the classification comprises classifying results showing two line failures in the FBM into SAs_6,e and SAs_7,f if the contact shift occurs at the coordinates being (6,e) and (7,f).

* * * * *